United States Patent
Ryu et al.

(10) Patent No.: US 7,097,959 B1
(45) Date of Patent: Aug. 29, 2006

(54) NEGATIVE RESIST COMPOSITION

(75) Inventors: Mi Sun Ryu, Daejeon (KR); Bong Seok Moon, Daejeon (KR); You Lee Pae, Daejeon (KR); Hyuk-Jin Cha, Daejeon (KR); Su Hyun Lee, Busan (KR); Young Hoe Kim, Daejeon (KR); Seok Keun Kim, Daegu (KR); Haeng-kyu Cho, Kongju-Si (KR); Jin Kyu Park, Yesan-Sun (KR); Dae Ho Shin, Deajeon (KR)

(73) Assignee: ADMS Technology Co., Ltd., Chungcheongnam-do (KR)

( * ) Notice: Subject to any disclaimer, the term of this patent is extended or adjusted under 35 U.S.C. 154(b) by 0 days.

(21) Appl. No.: 11/207,143

(22) Filed: Aug. 17, 2005

(30) Foreign Application Priority Data

Jun. 23, 2005 (JP) .................. 10-2005-0054354

(51) Int. Cl.
    *G03F 7/08* (2006.01)
(52) U.S. Cl. .................................. 430/280.1
(58) Field of Classification Search ............. 430/280.1
    See application file for complete search history.

(56) References Cited

U.S. PATENT DOCUMENTS

2003/0036018 A1 *  2/2003  Li ........................... 430/280.1

FOREIGN PATENT DOCUMENTS

EP           581536 A1 *  2/1994
KR         10-0268697      7/2000

* cited by examiner

*Primary Examiner*—Cynthia Hamilton
(74) *Attorney, Agent, or Firm*—Jones Day

(57) ABSTRACT

A negative resist composition used in a liquid-crystal display element is disclosed. The negative resist composition according to the present invention includes a binder resin consisting of a copolymer including four predetermined monomers, a (meth)acryl monomer including at least 3 (meth)acryl groups, a (meth)acryl monomer including one or two (meth)acryl groups and a photo-initiator. The negative resist composition according to the present invention may be useful to significantly increase the manufacturing yield because it shows an extremely low brittleness during a bonding process or a hot process due to good physical properties such as film retention, pattern stability, adhesion to a substrate, and chemical resistance, as well as good flexibility upon formation of the pattern.

8 Claims, No Drawings

NEGATIVE RESIST COMPOSITION

BACKGROUND OF THE INVENTION

1. Field of the Invention

The present invention relates to negative resist composition used in a liquid-crystal display (LCD), and more specifically to negative resist composition capable of being developed with an aqueous alkaline developer solution to form a pattern into an organic insulator layer, R.G.B., a liquid crystal alignment layer, a photo spacer, or a UV overcoat of a liquid-crystal display element such as TFT-LCD.

2. Description of the Related Art

Good physical properties such as uniformity, an adhesive property, chemical resistance and toughness are required for a pattern used in an organic insulator layer, R.G.B., a liquid crystal alignment layer, a photo spacer, a UV overcoat of a liquid-crystal display element. The negative resist composition including a binder resin, a multi-functional monomer having an ethylenic unsaturated bond, and photo-initiator is preferably used as resist composition to form such a pattern, as disclosed in Korean Patent Publication No.: 10-268697.

However, a pattern formed by using the conventional negative resist compositions has insufficient ductility. That is to say, the binder resin in the negative resist composition may have an insufficient ductility in itself because it is generally composed of a ternary copolymer consisting of an acid including an unsaturated group, an acid anhydrides including the unsaturated group, or a mixture thereof; a (meth)acrylic acid derivative substituted with an epoxy group; and a (meth)acrylic acid derivative substituted with an alkyl group having 6 or less carbon atoms, or monomers having unsaturated double bonds such as cyclic alkyl ester, styrene and so on. And also the pattern may be easily brittled due to an increased cross-linking density because at least 3-valent (meth)acryl monomer is used as a multi-functional monomer having an ethylenic unsaturated bond, which may cross-link the binder resin to give chemical resistance and thermal resistance to the pattern.

As described above, the pattern formed by using the conventional negative resist composition has a disadvantage that because the pattern has insufficient ductility it is easily brittled by an external force applied in the bonding process, or by difference of a thermal expansion coefficient with a substrate caused in the hot process, thereby resulting in reduction of a manufacturing yield.

SUMMARY OF THE INVENTION

The present invention is designed to solve the problems of the prior art, and therefore it is an object of the present invention to provide negative resist composition showing good physical properties such as retention ratio, pattern stability, adhesion to a substrate, and chemical resistance upon formation of the pattern, as well as an extremely low brittleness due to excellent ductility during the bonding process or the hot process.

In order to achieve the above mentioned object, the present invention provides negative resist composition, including (a) 3 to 40 parts by weight of a binder resin consisting of copolymers of monomers including monomers of the following i) to iv); i) 10 to 50 mol % of an acid including an unsaturated group having 3 to 10 carbon atoms, an acid anhydrides including the unsaturated group, or a mixture thereof, ii) 5 to 50 mol % of a (meth)acrylic acid derivative substituted with an epoxy group having 3 to 10 carbon atoms, iii) 1 to 35 mol % of a (meth)acrylic acid derivative substituted with an alkyl group having 7 to 16 carbon atoms, and iv) 5 to 55 mol % of a (meth)acrylic acid derivative substituted with an alkyl group having 1 to 6 carbon atoms, or a compound including 4 to 14 carbon atoms having an unsaturated double bond, which is selected from the group consisting of methyl(meth)acrylate, ethyl (meth)acrylate, propyl(meth)acrylate, butyl(meth)acrylate, pentyl(meth)acrylate, hexyl(meth)acrylate, cyclohexyl (meth)acrylate, isobonyl(meth)acrylate, adamantyl(meth) acrylate, dicyclopentanyl(meth)acrylate, dicyclopentenyl (meth)acrylate, benzyl(meth)acrylate, 2-methoxyethyl (meth)acrylate, 2-ethoxyethyl(meth)acrylate, styrene, α-methylstyrene, acetoxystyrene, N-methylmaleimide, N-ethylmaleimide, N-propylmaleimide, N-butylmaleimide, N-cyclohexylmaleimide, (meth)acrylamide and N-methyl (meth)acrylamide; (b) 1 to 40 parts by weight of a (meth) acryl monomer including at least 3 (meth)acryl groups; (c) 1 to 40 parts by weight of a (meth)acryl monomer including one or two (meth)acryl groups; and (d) 0.01 to 10 parts by weight of a photo-initiator.

The negative resist composition according to the present invention is characterized in that the monomers of the (b) and (c) are simultaneously added at a suitable amount to incorporate the monomers of the iii) and iv) into the binder resin, for example a copolymer, and appropriately control a cross-linking density of the binder resin to improve ductility of a binder resin itself, as well as chemical resistance and a thermal property. Accordingly, the pattern formed by using the negative resist composition according to the present invention shows good physical properties such as retention ratio, pattern stability, adhesion to a substrate, and chemical resistance, as well as an extremely low brittleness due to excellent ductility during the bonding process or the hot process.

DESCRIPTION OF THE PREFERRED EMBODIMENT

Hereinafter, preferred embodiments of the invention will be described in detail. Prior to the description, it should be understood that the terms used in the specification and appended claims should not be construed as limited to general dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purposes of illustrations only, not intended to limit the scope of the invention, so it should be understood that other equivalents and modifications could be made thereto without departing from the spirit and scope of the invention.

The present invention will be described in detail with the negative resist composition, as follows.

The negative resist composition of the present invention is a binder resin which includes 3 to 40 parts by weight of a copolymer (a) made of monomers including the following content of the compound in the following i) to iv).

i) an acid including an unsaturated group having 3 to 10 carbon atoms, an acid anhydrides including the unsaturated group, or a mixture thereof, which has a content of 10 to 50 mol % in the copolymer. An example of such a monomer in the i) includes acrylic acid, methacrylic acid, itaconic acid, maleic acid, maleic anhydride, monoakyl ester maleic acid, monoalkyl itaconate, monoalkyl fumarate, etc., and they may be used alone or with a mixture thereof.

ii) a (meth)acrylic acid derivative substituted with an epoxy group having 3 to 10 carbon atoms, which has a content of 5 to 50 mol % in the copolymer. An example of such a monomer in the ii) includes glycidylacrylate, glycidyl methacrylate, 3,4-epoxybutyl(meth)acrylate, 2,3-epoxycyclohexyl(meth)acrylate, 3,4-epoxycyclohexylmethyl(meth)

acrylate, 3-methyloxetane-3-methyl(meth)acrylate, 3-ethyloxetane-3-methyl(meth)acrylate, etc., and they may be used alone or with a mixture thereof.

iii) a (meth)acrylic acid derivative substituted with an alkyl group having 7 to 16 carbon atoms, which has a content of 1 to 35 mol % in the copolymer. The monomer in the iii) improves a ductility of the copolymer itself because it has a long alkyl group. An example of such a monomer in the iii) includes heptyl(meth)acrylate, octyl(meth)acrylate, nonyl(meth)acrylate, decyl(meth)acrylate, lauryl(meth)acrylate, dodecyl(meth)acrylate, tetradecyl(meth)acrylate and hexadecyl(meth)acrylate, etc., and they may be used alone or with a mixture thereof.

iv) a (meth)acrylic acid derivative substituted with an alkyl group having 1 to 6 carbon atoms, or a compound including an unsaturated double bond having 4 to 14 carbon atoms, which is selected from the group consisting of methyl(meth)acrylate, ethyl(meth)acrylate, propyl(meth)acrylate, butyl(meth)acrylate, pentyl(meth)acrylate, hexyl(meth)acrylate, cyclohexyl(meth)acrylate, isobonyl(meth)acrylate, adamantyl(meth)acrylate, dicyclopentanyl(meth)acrylate, dicyclopentenyl(meth)acrylate, benzyl(meth)acrylate, 2-methoxyethyl(meth)acrylate, 2-ethoxyethyl(meth)acrylate, styrene, α-methylstyrene, acetoxystyrene, N-methylmaleimide, N-ethylmaleimide, N-propylmaleimide, N-butylmaleimide, N-cyclohexylmaleimide, (meth)acrylamide and N-methyl(meth)acrylamide, which has a content of 5 to 55 mol % in the copolymer, alone or with a mixture thereof. The monomer in the iv) improves chemical resistance and thermal property of the copolymer.

The above-mentioned copolymer of the negative resist composition used as the binder resin preferably has an average molecular weight of 2,000 to 300,000, a polydispersity of 1.0 to 10.0, and an acid value of 10 to 400 KOH mg/g, and more preferably an average molecular weight of 4,000 to 100,000, a polydispersity of 1.5 to 3.0, and an acid value of 20 to 200 KOH mg/g.

The negative resist composition of the present invention includes 1 to 40 parts by weight of the (meth)acryl monomer (b) including at least 3 (meth)acryl groups. The monomer (b) cross-links the binder resins to give chemical resistance and thermal resistance when the negative resist composition is used to form a pattern. The monomer (b) may significantly reduce a cross-linking density if it has a content of less than 1 part by weight, while the monomer (b) increases a cross-linking density, thereby resulting in reduction of toughness of the pattern if it exceeds a content of 40 parts by weight. An example of such a monomer (b) includes a compound obtained by esterifying polyhydric alcohol with α,β-unsaturated carboxylic acid, which is selected from the group consisting of trimethylolpropanetri(meth)acrylate, pentaerythritoltri(meth)acrylate, pentaerythritoltetra(meth)acrylate, dipentaerythritolpenta(meth)acrylate, dipentaerythritolhexa(meth)acrylate, dipentaerythritoltri(meth)acrylate; and acrylic acid adducts of polyhydric glycidyl compounds such as trimethylol propane triglycidyl ether acrylic acid adducts, etc., and they may be used alone or with a mixture thereof.

In addition, the negative resist composition of the present invention has 1 to 40 parts by weight of a (meth)acryl monomer (c) including one or two (meth)acryl groups. The monomer (c) decreases a cross-linking density of the resist and therefore improves toughness of the patterns because it has at most two (meth)acryl groups. That is to say, the monomer (c) functions to control the cross-linking density of the resist cross-linked by the monomer (b) as mentioned previously. The monomer (c) significantly increases a cross-linking density of the resist due to a relatively high content of the monomer (b) as mentioned previously if it has a content of less than 1 part by weight, while the monomer (b) significantly reduces a cross-linking density of the resist, thereby resulting in deterioration of chemical resistance and thermal resistance of the pattern if it exceeds a content of 40 parts by weight. An example of such a monomer (c) includes methyl(meth)acrylate, ethyl(meth)acrylate, butyl(meth)acrylate, 2-ethylhexyl(meth)acrylate, alkylester of (meth)acrylic acid such as lauryl(meth)acrylate, glycidyl(meth)acrylate, polyethyleneglycolmono(meth)acrylate including 2 to 14 ethyleneoxide groups, ethyleneglycoldi(meth)acrylate, polyethyleneglycoldi(meth)acrylate including 2 to 14 ethyleneoxide groups, propyleneglycoldi(meth)acrylate including 2 to 14 propyleneoxide groups, trimethylolpropanedi(meth)acrylate, bisphenol A diglycidyletheracrylic acid adducts, phthalate diester of β-hydroxyethyl(meth)acrylate, toluene diisocyanate adducts of β-hydroxyethyl(meth)acrylate, etc., and they may be used alone or with a mixture thereof.

Moreover, the negative resist composition of the present invention has 0.01 to 10 parts by weight of a photo-initiator (d). The conventional photo-initiator, for example acetophenone-based or benzophenone-based photo-initiators may be generally used in the negative resist composition. Since a colored photo-initiator lowers transparency, high transparency may be achieved by using a photo-initiator having suitable sensitivity at the exposure wavelength and having no color in itself. Generally, a photo-initiator used in a cross-linking reaction of an acrylic multifunctional monomer is chosen considering UV wavelength used. A photo-initiator that generates radicals within this wavelength range of 310~450 μm is preferably used.

As mentioned above, it is preferred to use an acetophenone-based, benzophenone-based, or triazine-based photo-initiator such as Irgacure 651, Irgacure 907, TPO, CGI124, and EPD/BMS mixture. For example, the photo-initiator includes benzophenone, phenyl biphenyl ketone, 1-hydroxy-1-benzoylcyclohexane, benzyl, benzyldimethylketal, 1-benzyl-1-dimethylamino-1-(4-morpholino-benzoyl)propane, 2-morpholyl-2-(4-methylmercapto)benzoylpropane, thioxanthone, 1-chloro-4-proxythioxanthone, isopropylthioxanthone, diethylthioxanthone, ethylanthraquinone, 4-benzoyl-4-methyldiphenylsulfide, benzoinbutylether, 2-hydroxy-2-benzoylpropane, 2-hydroxy-2-(4-isopropyl)benzoylpropane, 4-butylbenzoyltrichloromethane, 4-phenoxybenzoyldichloromethane, methyl benzoylformate, 1,7-bis(9-acridinyl)heptane, 9-n-butyl-3,6-bis(2-morpholino-isobutyroyl)carbazole, 2-methyl-4,6-bis(trichloromethyl)-s-triazine, 2-phenyl-4,6-bis(trichloromethyl)-s-triazine, 2-naphthyl-4,6-bis(trichloromethyl)-s-triazine. The photo-initiator may be used at a effective amount of 0.01 to 10 parts by weight, and preferably 0.5 to 7 parts by weight to improve transparency and minimize exposure doses.

In addition, a silicon-based compound containing an epoxy or amine group may, if necessary, be added as an auxiliary adhesion additive to the negative resist composition of the present invention. Such a silicon-based compound may improve adhesion between ITO electrode and the negative resist composition, and also increases heat resistance after hardening. The silicon-based compound containing the epoxy or amine group includes (3-glycidoxypropyl)trimethoxysilane, (3-glycidoxypropyl)triethoxysilane, (3-glycidoxypropyl)methyldimethoxysilane, (3-glycidoxypropyl)methyldiethoxysilane, (3-glycidoxypropyl)dimethylmethoxysilane, (3-glycidoxypropyl)dimethylethoxysilane, 3,4-epoxybutyltrimethoxysilane, 3,4-epoxybutyltriethoxysilane, 2-(3,4-epoxycyclohexyl)ethyltrimethoxysilane, 2-(3,4-epoxycyclohexyl)ethyltriethoxysilane and aminopropyltrimethoxy silane, etc, and they may be used alone or with a mixture thereof. The silicon compound preferably has a content of 0.001 to 3 parts by weight.

Additionally, compatible additives such as a photosensitizer, a thermal polymerization inhibitor, a defoaming agent and a leveling agent may, if necessary, be added to the negative resist composition of the present invention.

A pattern of the negative resist composition of the present invention may be formed by means of a developing process using an aqueous alkaline developer solution, by adding a solvent to spin-coat the negative resist composition onto a substrate, followed by irradiating ultraviolet rays to the substrate using a mask. For example, the solvent is preferably added so that the negative resist composition of the present invention has 1 to 50 cps of viscosity. Considering compatibility with a binder resin, a photo-initiator and other compounds, the solvent includes ethylacetate, butylacetate, diethylene glycol dimethyl ether, diethylene glycol dimethylethyl ether, methylmethoxy propionate, ethylethoxy propionate (EEP), ethyl lactate, propylene glycol methyl ether acetate (PGMEA), propylene glycol methyl ether propionate (PGMEP), propylene glycol methyl ether, propylene glycol propyl ether, methylcellosolvacetate, ethylcellosolvacetate, diethylene glycol methyl acetate, diethylene glycol ethyl acetate, acetone, methyl isobutyl ketone, cyclohexanone, dimethylformamide (DMF), N,N-dimethylacetamide (DMAc), N-methyl-2-pyrrolidone (NMP), γ-butyrolactone, diethyl ether, ethylene glycol dimethyl ether, diglyme, tetrahydrofuran (THF), methanol, ethanol, propanol, iso-propanol, methylcellosolve, ethylcellosolve, diethylene glycol methyl ether, diethylene glycol ethyl ether, dipropylene glycol methyl ether, toluene, xylene, hexane, heptane, octane etc., and they may be used alone or with a mixture thereof.

Hereinafter, the present invention will be described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

Embodiment 1

200 ml of PGMEA (propylene glycol methyl ether acetate) and 0.4 g of AIBN were added to a 500 ml polymerization vessel, and then methacrylic acid, glycidylmethacrylate, heptylmethacrylate and cyclohexylacrylate were added at a molar ratio of 15:30:15:40. The resultant mixture was polymerized at 70° C. for 5 hours under a nitrogen atmosphere with stirring to obtain a copolymer.

The copolymer polymerized as a binder resin, the (meth)acryl monomer including at least 3 (meth)acryl groups, the (meth)acryl monomer including one or two (meth)acryl groups, and the photo-initiator were added to a bath equipped with a UV-absorbing layer and a stirrer, based on constituents presented in the following Table 1. And then 3-aminopropyl-trimethoxysilane (an auxiliary adhesion additive, 0.1% by weight) and FC-430 (a leveling agent from 3M, 0.1% by weight) were sequentially added to the bath, and stirred at a room temperature to obtain negative resist composition. Subsequently, the solvent PGMEA (to 100% by weight) was added to the resultant negative resist composition to adjust its viscosity to be 15 cps.

Embodiments 2 to 10

The negative resist composition was prepared in the same manner as in the embodiment 1, except that the kind of the binder resin, the kinds and contents of the (meth)acryl monomer including at least 3 (meth)acryl groups and the (meth)acryl monomer including one or two (meth)acryl groups, and the kind of the photo-initiator were changed based on the composition presented in the Table 1.

TABLE 1

|   | Composition of a binder resin (copolymer) of the General formula 1 (30% by weight) | A (meth)acryl monomer with at least 3 (meth)acrylic groups (% by weight) | A (meth)acryl monomer with 1 or 2 (meth)acrylic groups (% by weight) | Photo-initiator (2% by weight) |
|---|---|---|---|---|
| 1 | i) Methacrylic acid (15 mol %) ii) Glycidylmethacrylate (30 mol %) iii) Heptylmethacrylate (15 mol %) iv) Cyclohexylacrylate (40 mol %) | Dipentaerythritol-hexaacrylate (20) | Cyclohexylacrylate (20) | Irgacure 651 |
| 2 | i) Methacrylic acid (20 mol %) ii) Glycidylacrylate (30 mol %) iii) Decylmethacrylate (20 mol %) iv) Butylmethacrylate (30 mol %) | Dipentaerythritolhexa/pentaacrylate (35) | Decylacrylate (5) | Irgacure 369 |
| 3 | i) Maleic acid (20 mol %) ii) Glycidylmethacrylate (40 mol %) iii) Decylmethacrylate (10 mol %) iv) Isobonylmethacrylate (30 mol %) | Dipentaerythritol-pentaacrylate (25) | Diethyleneglycol-diacrylate (10) | Irgacure 369 |
| 4 | i) Methacrylic acid (15 mol %) ii) 2,3-epoxycyclohexylmethacrylate (30 mol %) iii) Nonylmethacrylate (15 mol %) iv) Benzylmethacrylate (40 mol %) | Dipentaerythritol-hexaacrylate (10) | Glycidylmethacrylate (20) | Benzophenone |
| 5 | i) Acrylic acid (20 mol %) ii) Glycidylmethacrylate (35 mol %) iii) Hexadecylacrylate (15 mol %) iv) Methylmaleimide (30 mol %) | Dipentaerythritol-pentamethacrylate (20) | Polyethyleneglycol-diacrylate (10) | Triphenyl-phophinoxide |
| 6 | i) Methacrylic acid (20 mol %) ii) 3-methyloxetane-3-methylmethacrylate (30 mol %) iii) Dodecyacrylate (15 mol %) iv) Methylmethacrylate (35 mol %) | Dipentaerythritol-hexamethacrylate (20) | Cyclohexylacrylate (20) | Irgacure 651 |
| 7 | i) Methacrylic acid (15 mol %) ii) Glycidylmethacrylate (30 mol %) | Pentaerythritol-triacrylate (20) | Glycidylacrylate (10) | Irgacure 651 |

TABLE 1-continued

| Composition of a binder resin (copolymer) of the General formula 1 (30% by weight) | A (meth)acryl monomer with at least 3 (meth)acrylic groups (% by weight) | A (meth)acryl monomer with 1 or 2 (meth)acrylic groups (% by weight) | Photo-initiator (2% by weight) |
|---|---|---|---|
| iii) Decylacrylate (15 mol %)<br>iv) Benzylmethacrylate (40 mol %) | | | |
| 8  i) Methacrylic acid (15 mol %)<br>ii) Glycidylacrylate (30 mol %)<br>iii) Decylmethacrylate (15 mol %)<br>iv) Cyclohexylmaleimide (40 mol %) | Pentaerythritol-trimethacrylate (20) | Isobonylacrylate (10) | CGI124 |
| 9  i) Maleic acid (15 mol %)<br>ii) Glycidylmethacrylate (30 mol %)<br>iii) Heptylmethacrylate (15 mol %)<br>iv) Stylene (40 mol %) | Dipentaerythritol-hexaacrylate (10) | Ethyleneglycol-diacrylate (5) | Benzoin-butylether |
| 10  i) Methacrylic acid (10 mol %)<br>ii) 3,4-epoxycyclohexylmethacrylate (40 mol %)<br>iii) Nonylacrylate (15 mol %)<br>iv) Cyclohexylmaleimide (35 mol %) | Trimethylolpropane-triacrylate (5) | Ethyleneglycol-diacrylate (15) | Benzoin-butylether |

In the Table 1, the copolymer has an average molecular weight of about 9,000, a polydispersity of about 2.1, and an acid value of about 110.

Comparative Embodiments 1 and 2

As shown in the Table 2, the negative resist composition was prepared in the same manner as in the embodiment 1, except that the copolymer as presented in a following General formula 1 was used as a binder resin instead of the copolymer of the embodiment 1, and a (meth)acryl monomer including one or two (meth)acryl groups was not added to the negative resist composition.

General formula 1

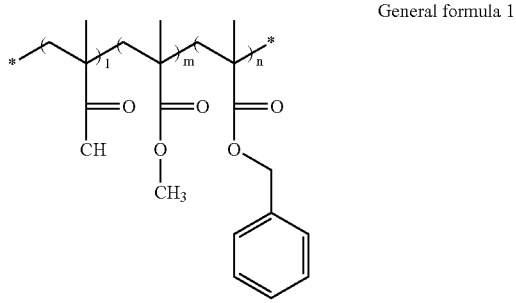

were performed on substrates such as a silicon wafer or a glass. Basic performances of the negative resist composition such as adhesive property, retention ratio, chemical resistance, pattern stability, and ductility were tested as below. The results are shown in the following Tables 3 and 4.

(1) Adhesive Property

The negative resist composition was applied onto a substrate using a spin coater at a rotary speed of 800 rpm for 8 seconds, and pre-baked at 100° C. for 1 minute, exposed to a wavelength of 365 nm for 15 seconds, and then post-baked at 240° C. for 30 minutes to form a resist film, which was then aged at 100° C. for 1 hour in an autoclave. Samples aged in the autoclave were tested by scratching the samples with a cross hatch cutter to reveal the substrates, followed by adhering a tape to the substrates and removing the tape from the substrates. We denoted that the adhesive property of the negative resist composition is 'good' if 80 cells out of 100 cells are adhered to the tape, otherwise 'poor'.

(2) Retention Ratio

The negative resist composition was spin-coated onto a substrate, and then pre-baked. Then, the ratio (%) of the thickness of a film after pre-baking and a film formed after removing the solvent from the substrate by post-baking was measured.

(3) Pattern Stability

The silicon wafer forming a negative resist pattern was cut in a perpendicular direction of a hole pattern and observed from the cross-sectional direction of the pattern

TABLE 2

| Comparative embodiments | Composition of a binder resin (copolymer) of the General formula 1 (30% by weight) | A (meth)acryl monomer with at least 3 (meth)acrylic groups (20% by weight) | Photo-initiator (20% by weight) |
|---|---|---|---|
| 1 | l = 0.3, m = 0.2, n = .05 | Dipentaerythritolhexaacrylate | Irgacure 651 |
| 2 | l = 0.3, m = 0.3, n = .04 | Dipentaerythritolhexaacrylate | Irgacure 651 |

In the Table 2, the binder resins of the General formula 1 have an average molecular weight of 10,000, a polydispersity of 2.5, and an acid value of 100.

The evaluations of the negative resist composition according to the Embodiments and the Comparative embodiment using an electron microscope. We denoted that the pattern stability of the negative resist composition is 'good' if a side wall of the pattern was slanted at an angle of 55° against the substrate and a significant reduction of the film was not observed, otherwise 'poor'.

(4) Chemical Resistance

The negative resist composition was applied onto the substrate using a spin coater, and then a resist film was formed by means of the pre-bake and post-bake processes. The resultant resist film was dipped into a stripper and etchant solution at 40° C. for 10 minutes, and then observed whether the transmissivity and thickness of the resist film was changed or not. We denoted that the chemical resistance of the negative resist composition is 'good' if the transmissivity and thickness of the resist film was not changed, otherwise 'poor'.

(5) Ductility

The negative resist composition was applied onto the substrate using a spin coater at a rotary speed of 800 rpm for 8 seconds, pre-baked at 100° C. for 1 minute, exposed to a wavelength of 365 nm for 15 seconds, and then developed with an aqueous TMAH solution to form a 20 µm×20 µm pattern. The formed pattern was post-baked at 220° C. for 30 minutes to be cross-linked to each other, and then the ductility of the pattern was measured using a nano indentor. We denoted that the ductility of the negative resist composition is 'good' if the total of changed amount by 5 g.f loading amounts to 500 nm or more upon evaluation by the nano indentor, and 'poor' if it amounts to 500 nm or less.

TABLE 3

| Embodiments | Adhesion | Retention ratio (%) | Pattern stability | Chemical resistance | Ductility |
|---|---|---|---|---|---|
| 1 | Good | 90 | Good | Good | Good |
| 2 | Good | 90 | Good | Good | Good |
| 3 | Good | 92 | Good | Good | Good |
| 4 | Good | 90 | Good | Good | Good |
| 5 | Good | 90 | Good | Good | Good |
| 6 | Good | 91 | Good | Good | Good |
| 7 | Good | 88 | Good | Good | Good |
| 8 | Good | 89 | Good | Good | Good |
| 9 | Good | 90 | Good | Good | Good |
| 10 | Good | 90 | Good | Good | Good |

TABLE 4

| Embodiments | Adhesion | Retention ratio (%) | Pattern stability | Chemical resistance | Ductility |
|---|---|---|---|---|---|
| 1 | Poor | 82 | Poor | Poor | Poor |
| 2 | Poor | 80 | Poor | Poor | Poor |

As seen in the Tables 3 and 4, the negative resist composition of the present invention has very excellent properties such as adhesion to a metal and an inorganic matter, retention ratio, chemical resistance, pattern stability and ductility, compared to the conventional negative resist composition.

APPLICABILITY TO THE INDUSTRY

As described above, the negative resist composition according to the present invention shows good physical properties such as retention ratio, pattern stability, adhesion to a substrate, and chemical resistance upon formation of the pattern, as well as excellent ductility during the bonding process or the repeated hot process. Accordingly, the negative resist composition according to the present invention may show an extremely low brittleness although the external force is applied by difference of a thermal expansion coefficient with a substrate in the bonding process or the repeated hot process, thereby resulting in a significantly increased manufacturing yield.

The present invention has been described in detail. However, it should be understood that the detailed description and specific examples according to preferred embodiments of the invention are given by way of illustration only, since various changes and modifications within the spirit and scope of the invention will become apparent to those skilled in the art from this detailed description.

What is claimed is:

1. A negative resist composition, comprising;
   (a) 3 to 40 parts by weight of a binder resin consisting of copolymers of monomers including monomers of the following i) to iv);
      i) 10 to 50 mol % of an acid including an unsaturated group having 3 to 10 carbon atoms, an acid anhydrides including the unsaturated group, or a mixture thereof,
      ii) 5 to 50 mol % of a (meth)acrylic acid derivative substituted with an epoxy group having 3 to 10 carbon atoms,
      iii) 1 to 35 mol % of a (meth)acrylic acid derivative substituted with a linear alkyl group having 7 to 16 carbon atoms, and
      iv) 5 to 55 mol % of a (meth)acrylic acid derivative substituted with an alkyl group having 1 to 6 carbon atoms, or a compound including 4 to 14 carbon atoms having an unsaturated double bond, which is selected from the group consisting of methyl(meth) acrylate, ethyl(meth)acrylate, propyl(meth)acrylate, butyl(meth)acrylate, pentyl(meth)acrylate, hexyl (meth)acrylate, cyclohexyl(meth)acrylate, isobonyl (meth)acrylate, adamantyl(meth)acrylate, dicyclopentanyl(meth)acrylate, dicyclopentenyl(meth) acrylate, benzyl(meth)acrylate, 2-methoxyethyl (meth)acrylate, 2-ethoxyethyl(meth)acrylate, styrene, α-methylstyrene, acetoxystyrene, N-methylmaleimide, N-ethylmaleimide, N-propylmaleimide, N-butylmaleimide, N-cyclohexylmaleimide, (meth)acrylamide and N-methyl(meth)acrylamide;
   (b) 1 to 40 parts by weight of a (meth)acryl monomer including at least three (meth)acryl groups;
   (c) 1 to 40 parts by weight of a (meth)acryl monomer including one or two (meth)acryl groups; and
   (d) 0.01 to 10 parts by weight of a photo-initiator.

2. The negative resist composition according to claim 1, wherein the monomer of the compound (iii) is selected from the group consisting of heptyl(meth)acrylate, octyl(meth) acrylate, nonyl(meth)acrylate, decyl(meth)acrylate, lauryl (meth)acrylate, dodecyl(meth)acrylate, tetradecyl(meth) acrylate and hexadecyl(meth)acrylate, or a mixture thereof.

3. The negative resist composition according to claim 1, wherein the copolymer has 2,000 to 300,000 of an average molecular weight, 1.0 to 10.0 of a polydispersity, 10 to 400 KOH mg/g of an acid value.

4. The negative resist composition according to claim 1, wherein the (meth)acryl monomer including at least three (meth)acryl groups comprises a compound selected from the group consisting of trimethylolpropanetri(meth)acrylate, pentaerythritoltri(meth)acrylate, pentaerythritoltetra(meth) acrylate, dipentaerythritolpenta(meth)acrylate, dipentaerythritolhexa(meth)acrylate and dipentaerythritoltri (meth)acrylate; trimethylolpropanetriglycidyletheracrylic acid adducts; or a mixture thereof.

5. The negative resist composition according to claim 1, wherein the (meth)acryl monomer including one or two (meth)acryl groups comprises at least one compound selected from the group consisting of alkylester of (meth) acrylic acid, glycidyl(meth)acrylate, polyethyleneglycolmono(meth)acrylate including 2 to 14 ethyleneoxide groups, ethyleneglycoldi(meth)acrylate polyethyleneglycoldi(meth)acrylate including 2 to 14 ethyleneoxide groups, propyleneglycoldi(meth)acrylate including 2 to 14 propyleneoxide groups, trimethylolpropanedi(meth)acrylate, bisphenol A diglycidyletheracrylic acid adducts, phthalate diester of β-hydroxyethyl(meth)acrylate, and toluene diisocyanate adducts of β-hydroxyethyl(meth)acrylate.

6. The negative resist composition according to claim 1, further comprising 0.0001 to 3 parts by weight of a silicon-based compound including an epoxy group or an amine group.

7. The negative resist composition according to claim 6, wherein the silicon-based compound including the epoxy group or the amine group comprises at least one compound selected from the group consisting of (3-glycidoxypropyl) trimethoxysilane, (3-glycidoxypropyl)triethoxysilane, (3-glycidoxypropyl)methyldimethoxysilane, (3-glycidoxypropyl)methyldiethoxysilane, (3-glycidoxypropyl)dimethylmethoxysilane, (3-glycidoxypropyl)dimethylethoxysilane, 3,4-epoxybutyltrimethoxysilane, 3,4-epoxybutyltriethoxysilane, 2-(3,4-epoxycyclohexyl) ethyltrimethoxysilane, 2-(3,4-epoxycyclohexyl) ethyltriethoxysilane, and aminopropyl trimethoxysilane.

8. The negative resist composition according to claim 1, further comprising a solvent so as to have 1 to 50 cps of viscosity.

* * * * *